United States Patent
Saito et al.

(10) Patent No.: US 10,367,082 B2
(45) Date of Patent: Jul. 30, 2019

(54) SECONDARY CELL AND METHOD FOR MANUFACTURING SECONDARY CELL

(71) Applicant: KABUSHIKI KAISHA NIHON MICRONICS, Tokyo (JP)

(72) Inventors: Tomokazu Saito, Tokyo (JP); Yuki Sato, Tokyo (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 0 days.

(21) Appl. No.: 15/757,770

(22) PCT Filed: Aug. 3, 2016

(86) PCT No.: PCT/JP2016/003576
§ 371 (c)(1),
(2) Date: Mar. 6, 2018

(87) PCT Pub. No.: WO2017/043011
PCT Pub. Date: Mar. 16, 2017

(65) Prior Publication Data
US 2018/0342603 A1 Nov. 29, 2018

(30) Foreign Application Priority Data
Sep. 8, 2015 (JP) ................. 2015-176250

(51) Int. Cl.
*H01L 21/02* (2006.01)
*H01L 29/66* (2006.01)
(Continued)

(52) U.S. Cl.
CPC .. *H01L 29/66977* (2013.01); *H01L 21/02565* (2013.01); *H01L 22/14* (2013.01);
(Continued)

(58) Field of Classification Search
CPC ... H01L 21/02565; H01L 22/14; H01L 27/08; H01L 29/66969; H01L 29/66977; H01L 29/84; H01M 10/04; H01M 10/20
See application file for complete search history.

(56) References Cited

U.S. PATENT DOCUMENTS 9,673,271 B2 *  6/2017 Zampardi ............... H01L 28/60
2007/0166574 A1   7/2007 Nakashima et al.
(Continued)

FOREIGN PATENT DOCUMENTS

CN     104221200 A     12/2014
JP     WO2008053561 A1   2/2010
(Continued)

OTHER PUBLICATIONS

ISA Japanese Patent Office, International Search Report Issued in Application No. PCT/JP2016/003576, dated Oct. 11, 2016, WIPO, 3 pages.
(Continued)

*Primary Examiner* — Allan R Wilson
(74) *Attorney, Agent, or Firm* — McCoy Russell LLP

(57) ABSTRACT

The present invention provides a method for manufacturing a secondary cell having a plurality of unit cells 21 that are connected in parallel, including, a step to prepare sheet-shaped unit cells each having a structure that a first electrode layer, a metal oxide semiconductor layer, a charging layer, and a second electrode layer are layered, a step to form a cell sheet by connecting the laminated unit cells in parallel, a step to measure a capacity of the cell sheet, and a step to connect a unit cell for capacity adjustment to the cell sheet in parallel when the capacity is smaller than a specification value.

3 Claims, 6 Drawing Sheets

(51) Int. Cl.
*H01L 49/00* (2006.01)
*H01M 2/20* (2006.01)
*H01M 10/04* (2006.01)
*H01L 21/66* (2006.01)
*H01L 27/08* (2006.01)
*H01L 29/84* (2006.01)

(52) U.S. Cl.
CPC ........ *H01L 27/08* (2013.01); *H01L 29/66969* (2013.01); *H01L 29/84* (2013.01); *H01L 49/00* (2013.01); *H01M 2/20* (2013.01); *H01M 10/04* (2013.01); *Y02E 10/549* (2013.01); *Y02P 70/521* (2015.11)

(56) References Cited

U.S. PATENT DOCUMENTS

| | | | |
|---|---|---|---|
| 2010/0067089 A1 | 3/2010 | Nakazawa | |
| 2010/0125989 A1* | 5/2010 | Huang | H01G 4/33 29/25.42 |
| 2011/0300667 A1 | 12/2011 | Nakazawa | |
| 2014/0035096 A1* | 2/2014 | Tsai | H01L 22/14 257/528 |
| 2014/0327445 A1 | 11/2014 | Dewa et al. | |
| 2015/0072231 A1* | 3/2015 | Kudoh | H01M 2/263 429/209 |
| 2015/0111108 A1* | 4/2015 | Kudoh | H01M 2/263 429/246 |
| 2015/0188113 A1 | 7/2015 | Kudoh et al. | |
| 2018/0175293 A1* | 6/2018 | Ogasawara | H01L 43/10 |

FOREIGN PATENT DOCUMENTS

| | | |
|---|---|---|
| JP | 2014088068 A | 5/2014 |
| JP | WO2013035149 A1 | 3/2015 |
| JP | 2015088255 A | 5/2015 |
| JP | WO2013154046 A1 | 12/2015 |

OTHER PUBLICATIONS

Taiwan Intellectual Property Office, Office Action Issued in Application No. 105128631, dated Sep. 13, 2017, 4 pages. (Submitted with Partial Translation).

European Patent Office, Extended European Search Report Issued in Application No. 16843884.4, dated May 20, 2019, Germany, 8 pages.

* cited by examiner

SECONDARY CELL AND METHOD FOR MANUFACTURING SECONDARY CELL

CROSS-REFERENCE TO RELATED APPLICATIONS

The present application is a U.S. National Phase of International Patent Application Serial No. PCT/JP2016/003576, entitled "SECONDARY BATTERY AND SECONDARY BATTERY MANUFACTURING METHOD," filed on Aug. 3, 2016. International Patent Application Serial No. PCT/JP2016/003576 claims priority to Japanese Patent Application No. 2015-176250, filed on Sep. 8, 2015. The entire contents of each of the above-cited applications are hereby incorporated by reference in their entirety for all purposes.

TECHNICAL FIELD

The present invention relates to a cell (called a secondary cell) capable of repeatedly performing charging-discharging and a method for manufacturing a secondary cell.

BACKGROUND ART

Patent Documents 1, 2 disclose a quantum cell that is an all-solid-state physical secondary cell. The quantum cell disclosed in Patent Document 1 has a structure that a first electrode layer, an n-type metal oxide semiconductor layer, a charging layer, a p-type metal oxide semiconductor layer, and a second electrode layer are layered on a substrate. The charging layer is a layer capable of capturing electrons obtained through photoexcited structural change caused on a particle-like n-type metal oxide semiconductor that is covered with an insulating material.

In the disclosure of Patent Document 1, a plurality of quantum cells are connected in series to increase a terminal voltage or connected in parallel to increase current capacity. Further, Patent Document 2 discloses a method and an apparatus to measure charging-discharging characteristics and electrical characteristics of a quantum cell.

CITATION LIST

Patent Literature

Patent Document 1: International Patent Publication No. WO2013/154046
Patent Document 2: International Patent Publication No. WO2013/035149

SUMMARY OF INVENTION

Technical Problem

A configuration disclosed in Patent Document 1 includes, for example, a plurality of sheet-shaped cells (hereinafter, called unit cells), each being a minimum unit functioning as a secondary cell that includes a charging layer between a first electrode layer (negative electrode) and a second electrode layer (positive electrode). Here, the plurality of unit cells are layered with the first electrode layers and the second electrode layers thereof faced, respectively. Thus, a cell having the plurality of cells connected in series is disclosed.

Further, Patent Document 1 discloses a configuration that a plurality of unit cells are connected in parallel. Second electrode layers of two unit cells are faced to each other and a positive electrode terminal is sandwiched between the two unit cells. In this configuration, a pair of unit cells (sheet-shaped cells) sandwiching the positive electrode terminal serve as a layering unit. Cells being a plurality of the layering units are arranged with the first electrode layers thereof faced, respectively. Cells being adjacent two layering units are layered as sandwiching a negative electrode terminal. Further, it is also disclosed a cell in which the plurality of cells layered as being connected in series as described above are layered as being connected in parallel.

Thus, in Patent Document 1, a cell (hereinafter, called a cell-sheet) in which a plurality of sheet-shaped unit cells is electrically connected (as parallel connection, serial connection, or a combination thereof) and layered. According to the above, a terminal voltage or a capacity (a current capacity or an energy capacity) can be increased. Further, owing to forming a cell (hereinafter, called a collective cell) by combining and electrically connecting a plurality of cell-sheets, the terminal voltage or the capacity can be further increased.

In a case that a plurality of the unit cells or the cell-sheets (hereinafter, cells being a combination unit for forming a cell-sheet or a collective cell is called a combination unit cell) are to be connected in parallel, those having the same capacity are prepared and combined to manufacture a cell-sheet or a collective cell having a specific capacity. Therefore, there is a problem that a unit cell or a cell-sheet having a small capacity cannot be used for manufacturing a cell. Further, a cell including a unit cell or a cell-sheet having a small capacity may not satisfy the specification capacity. Here, since manufacturing has to be performed to have an accurate capacity, there arises a problem that time and cost are increased for the manufacturing.

In view of the abovementioned problems, an object of the present invention is to provide a secondary cell and a method for manufacturing a secondary cell capable of manufacturing a high-capacity secondary cell at high productivity.

Solution to Problem

According to an aspect of the present invention, it is provided a method for manufacturing a secondary cell having a plurality of unit cells that are connected in parallel, the method including steps of: preparing sheet-shaped unit cells each having a structure that a first electrode layer, a metal oxide semiconductor layer, a charging layer, and a second electrode layer are layered; forming a cell-sheet by layering the unit cells and connecting the unit cells in parallel; measuring a capacity of the cell-sheet; and connecting a unit cell for capacity adjustment to the cell-sheet in parallel when the capacity is smaller than a specification value. According to the above, since the unit cells having a variety of capacities can be used effectively, productivity can be improved.

According to an aspect of the present invention, it is provided a method for manufacturing a secondary cell having a plurality of unit cells that are connected in parallel, the method including steps of: preparing sheet-shaped unit cells each having a structure that a first electrode layer, a metal oxide semiconductor layer, a charging layer, and a second electrode layer are layered; measuring capacities of the unit cells, respectively; and manufacturing a cell-sheet obtained by combining and layering the unit cells having different capacities based on measurement results of the capacities and connecting the layered unit cells in parallel to have a capacity being equal to or larger than a specification value. According to the above, since the unit cells having a variety of capacities can be used effectively, productivity can be improved.

According to an aspect of the present invention, it is provided a method for manufacturing a secondary cell having a plurality of cell-sheets that are connected in parallel, the method including steps of: preparing cell-sheets each having a plurality of unit cells layered and connected in parallel after preparing sheet-shaped unit cells each having a structure that a first electrode layer, a metal oxide semiconductor layer, a charging layer, and a second electrode layer are layered; forming a collective cell by connecting cell-sheets in parallel; measuring a capacity of the collective cell; and connecting at least one of a unit cell for capacity adjustment and a cell-sheet for capacity adjustment to the collective cell in parallel when the capacity is smaller than a specification value. According to the above, since the cell-sheets having a variety of capacities can be used effectively, productivity can be improved.

In the method for manufacturing described above, the collective may include the cell-sheets having different capacities.

According to an aspect of the present invention, it is provided a method for manufacturing a secondary cell having a plurality of cell-sheets that are connected in parallel, the method including steps of: preparing cell-sheets each having a plurality of unit cells layered and connected in parallel after preparing sheet-shaped unit cells each having a structure that a first electrode layer, a metal oxide semiconductor layer, a charging layer, and a second electrode layer are layered; measuring capacities of the cell-sheets; and manufacturing a collective cell by combining and layering the cell-sheets having different capacities based on measurement results of the capacities and connecting the layered cell-sheets in parallel to have a capacity being equal to or larger than a specification value. According to the above, since the cell-sheets having a variety of capacities can be used effectively, productivity can be improved.

In the method for manufacturing described above, the cell-sheet may include the unit cells having different capacities.

In the method for manufacturing described above, suitability of a combination of the unit cells may be determined in accordance with a capacity ratio between a unit cell having a maximum capacity and a unit cell having a minimum capacity among all the unit cells included in the cell-sheet. According to the above, even when charging-discharging is repeated to some midpoint, deterioration of the cell can be prevented.

In the method for manufacturing described above, suitability of a combination of the cell-sheets may be determined in accordance with a capacity ratio between a unit cell having a maximum capacity and a unit cell having a minimum capacity among all the unit cells included in the collective cell. According to the above, even when charging-discharging is repeated to some midpoint, deterioration of the cell can be prevented.

In the method for manufacturing described above, a plurality of unit cells having different capacities may be prepared in advance as the unit cells for capacity adjustment, and the unit cell for capacity adjustment may be selected in accordance with measurement results of the capacities.

In the method for manufacturing described above, a plurality of the cell-sheets having different capacities may be prepared in advance as the cell-sheets for capacity adjustment, and the cell-sheet for capacity adjustment may be selected in accordance with measurement results of the capacities.

According to an aspect of the present invention, it is provided a secondary cell in which at least two unit cells are connected in parallel. Here, each of the unit cells has a structure that a first electrode, a metal oxide semiconductor layer, a charging layer, and a second electrode are layered, and the at least two unit cells include unit cells having different capacities. According to the above, since the unit cells having a variety of capacities can be used effectively, productivity can be improved.

According to an aspect of the present invention, it is provided a secondary cell in which at least two cell-sheets are connected in parallel. Here, each of the cell-sheets includes a plurality of sheet-shaped unit cells that are connected in parallel; each of the unit cells has a structure that a first electrode, a metal oxide semiconductor layer, a charging layer, and a second electrode are layered; and the at least two cell-sheets include cell-sheets having different capacities. According to the above, since the cell-sheets having a variety of capacities can be used effectively, productivity can be improved.

Advantageous Effects of Invention

It is an object to provide a secondary cell and a method for manufacturing a secondary cell capable of manufacturing a high-capacity secondary cell at high productivity.

DESCRIPTION OF EMBODIMENTS

In the following, embodiments of the present invention will be described with reference to the drawings. The description in the following is simply for preferable embodiments of the present invention and is not intended to limit the scope of the present invention to the following embodiments. In the following, elements having the same reference are to be substantially the same.

[Structure of Quantum Cell]

A technology of a quantum cell is applied to cells of respective embodiments described in the following. Before describing the respective embodiments, brief description will be provided on a quantum cell. A quantum cell is a cell capable of repeatedly performing charging-discharging (a secondary cell) based on an operational principle of enabling to capture electrons by utilizing a photoexcited structural change of a metal oxide semiconductor that is covered with an insulating material.

Figure 1:
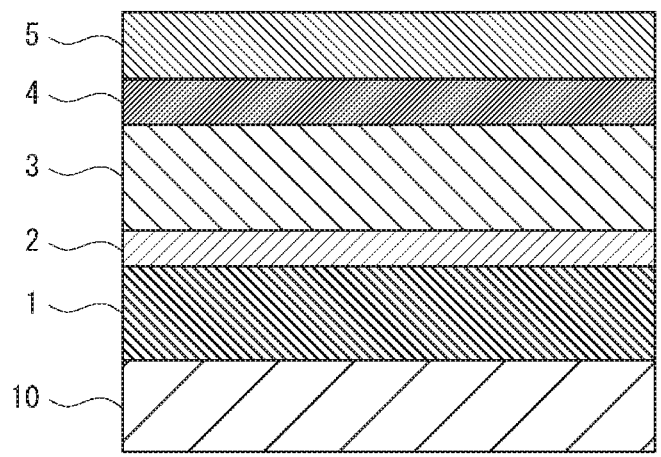
FIG. 1 is a sectional view illustrating a structure of a quantum cell.

A quantum cell is an all-solid-state physical secondary cell and solely functions as a cell. A structural example of a quantum cell is illustrated in FIG. 1. FIG. 1 is a view illustrating a sectional structure of a quantum cell to which the present invention is applied. Here, terminal members such as a positive electrode terminal and a negative electrode terminal and component members such as an exterior member and a cover member are not illustrated in FIG. 1.

A sheet-shaped cell 21 has a structure that a first electrode layer 1, an n-type semiconductor layer 2, a charging layer 3, a p-type semiconductor layer 4, and a second electrode layer 5 are layered on a substrate 10. In charging operation, that is, when a charging voltage (or a charging power) is applied between the first electrode layer 1 and the second electrode layer 5, the charging layer 3 stores (captures) electrons. In discharging operation, that is, when a load is connected between the first electrode layer 1 and the second electrode layer 5, the charging layer 3 releases the charged electrons. The charging layer 3 is a layer to keep the electrons (perform storing of electricity) in a state without charging-discharging. The charging layer 3 is formed by applying a photoexcited structural change technology.

The photoexcited structural change is described, for example, in International Patent Publication No. WO2008/053561. When effective excitation energy is applied to an insulation-coated metal oxide semiconductor having a band gap at a predetermined value or higher, a number of energy levels with no electrons are generated in the band gap. The quantum cell is charged by being caused to capture electrons in these energy levels and discharged by being caused to release the captured electrons.

The charging layer 3 is varied to be capable of storing electrons by being filled with insulation-coated n-type metal oxide semiconductor particles and causing the photoexcited structured change to happen at the n-type metal oxide semiconductor with ultrasonic irradiation. The charging layer 3 includes a number of the insulation-coated n-type metal oxide semiconductor particles. It is preferable to use titanium dioxide ($TiO_2$), tin dioxide ($SnO_2$), or zinc oxide (ZnO) as a material of the n-type metal oxide semiconductor that is capable of being used for the charging layer 3. It is also possible to use a material in which titanium dioxide, tin oxide, and zinc oxide are combined. The n-type metal oxide semiconductor in the charging layer is covered, for example, with silicon insulating coating.

The substrate 10 may be made of an insulating material or a conductive material. For example, it is possible to use a glass substrate, a resin sheet of a polymer film, or a metal foil sheet. In a case that a conductive material is used as the substrate 10, it is also possible to use the substrate 10 as the first electrode layer 1. That is, the conductive substrate 10 functions as the first electrode layer 1.

Regarding the electrode layers (the first electrode layer 1 and the second electrode layer 5) in the example illustrated in FIG. 1, the first electrode layer 1 is a negative electrode and the second electrode layer 5 is a positive electrode. The first electrode layer 1 and the second electrode layer 5 are simply required to be formed as conductive films. For example, a silver (Ag) alloy film containing aluminum (Al) or the like may be used as the metal material thereof. Alternatively, the first electrode layer 1 and the second electrode layer 5 may be translucent conductive films of indium tin oxide (ITO) or the like. Examples of a method for forming the conductive film include vapor phase film formation such as sputtering, ion plating, electron beam deposition, vacuum deposition, and chemical deposition. Further, the first electrode layer 1 and the second electrode layer 5 may be formed with an electrolytic plating process, a non-electrolytic plating process, or the like. In general, it is possible to use copper, copper alloy, nickel, aluminum, silver, gold, zinc, tin, or the like as a metal to be used for plating. Here, as described above, in the case that a conductive material is used for the substrate 10, the substrate 10 functions as the first electrode layer 1 and a forming process of the first electrode layer 1 can be skipped.

The n-type semiconductor layer 2 is, for example, an n-type metal oxide semiconductor layer and the material thereof may be titanium dioxide ($TiO_2$), tin dioxide ($SnO_2$), or zinc oxide (ZnO).

The n-type semiconductor layer 2 is formed to prevent the n-type metal oxide semiconductor from directly contacting to the first electrode layer 1 and electrons from being injected to the n-type metal oxide semiconductor due to recombination in a case that insulation coating of the n-type metal oxide semiconductor in the charging layer 3 is insufficient. As illustrated in FIG. 1, the n-type semiconductor layer 2 is formed between the first electrode layer 1 and the charging layer 3. It is also possible to eliminate the n-type semiconductor layer 2.

The p-type semiconductor layer 4 formed on the charging layer 3 is, for example, a p-type metal oxide semiconductor layer, and is formed to prevent electrons from being injected from the second electrode layer 5 arranged at the above. A p-type metal oxide semiconductor such as nickel oxide (NiO), copper-aluminum oxide ($CuAlO_2$), and the like may be used as a material of the p-type semiconductor layer 4. As illustrated in FIG. 1, the p-type semiconductor layer 4 is formed between the second electrode layer 5 and the charging layer 3.

In the above description, the n-type semiconductor layer 2 is arranged below the charging layer 3 and the p-type semiconductor layer 4 is arranged thereabove. However, the n-type semiconductor layer 2 and the p-type semiconductor layer 4 may be arranged in an opposite manner. That is, it is also possible that the n-type semiconductor layer 2 is arranged above the charging layer 3 and the p-type semiconductor layer 4 is arranged therebelow. In the opposite structure described above, when the n-type semiconductor layer 2 is eliminated, the second electrode 5 may be arranged above the charging layer 3 and the p-type semiconductor layer 4 may be arranged below the charging layer 3. In such a case, the first electrode layer 1 is a positive electrode and the second electrode layer 5 is a negative electrode. Thus, in the cell 21, as long as having a structure that, between the first electrode layer 1 and the second electrode layer 5, the charging layer 3 is sandwiched by the n-type semiconductor layer 2 and p-type semiconductor layer 4 or having a structure including the charging layer 3 and the p-type semiconductor layer 4, the layers may be arranged in any order. In other words, the sheet-shaped cell 21 is simply required to have a structure, between the first electrode layer 1 and the second electrode layer 5, that the first metal oxide semiconductor layer, the charging layer 3, and the second metal oxide semiconductor layer are layered in the order thereof or that the charging layer 3 and the metal oxide semiconductor layer are layered in the order thereof.

Further, a shape of the cell 21 in a plane view is not particularly limited and, for example, may be rectangular.

Here, the abovementioned sheet-shaped quantum cell 21 is a sheet-shaped cell that is a minimum unit functioning as a secondary cell and is called the unit cell 21 as described above.

In the following, embodiments will be described with a case that the substrate 10 is made of a conductive material and serves also as the first electrode layer 1 in the unit cell 21. Further, the description will be provided with a case that the shape of the cell 21 in a plane view is rectangular.

[First Embodiment]
[Structure of Cell-sheet]

Figure 2:
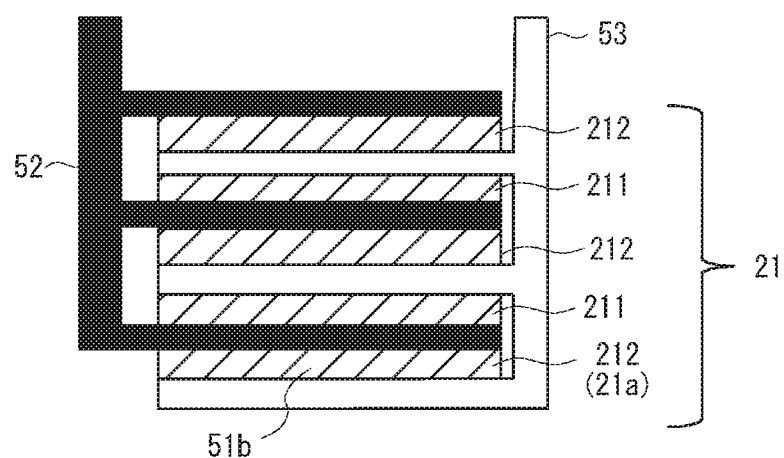
FIG. 2 is a view schematically illustrating a structure of a cell-sheet of the present embodiment.

In the following, a structure of a cell-sheet according to a first embodiment will be described with reference to FIG. 2. FIG. 2 is a sectional view schematically illustrating a structure of a cell-sheet 30 according to the present embodiment. The cell-sheet 30 is a cell obtained by layering and electrically connecting a plurality of unit cells 21 each being the sheet-shaped quantum cell 21 illustrated in FIG. 1.

In FIG. 2, the plurality of unit cells 21 are illustrated as unit cells 211 and unit cells 212. In the unit cells 211 among the plurality of unit cells 21, the first electrode layer 1 is located at the lower side and the second electrode layer 5 is located at the upper side. In the unit cells 212 among the plurality of unit cells 21, the first electrode layer 1 is located at the upper side and the second electrode layer 5 is located at the lower side.

The plurality of unit cells 21 are connected in parallel. The cell-sheet 30 includes a negative electrode terminal 52 and a positive electrode terminal 53. The negative electrode terminal 52 is connected to the first electrode layers 1 (negative electrodes) of the unit cells 21. The positive electrode terminal 53 is connected to the second electrode layers 5 (positive electrode) of the unit cells 21. The unit cells 211 and the unit cells 212 are layered alternately. The positive electrode terminal 53 is arranged between the second electrode layer 5 of the unit cell 211 and the second electrode layer 5 of the unit cell 212. The negative electrode terminal 52 is arranged between the first electrode layer 1 of the unit cell 211 and the first electrode layer 1 of the unit cell 212.

Regarding the unit cells 211, 212 located at both the outer sides, when the first electrode layer 1 is located at the outer side, the negative electrode terminal 52 is layered thereon. When the second electrode layer 5 is located at the outer side, the positive electrode terminal 53 is layered thereon.

FIG. 2 illustrates the cell-sheet 30 having five unit cells 21. However, the cell-sheet 30 may include six or more unit cells 21 and may include two or more and four or less unit cells 21. That is, a plurality of unit cells 21 are connected in parallel in the cell-sheet 30.

Here, the method for parallelly connecting and layering the plurality of unit cells 21 is not limited to that illustrated in FIG. 2. For example, it is possible that the plurality of unit cells 20 having the same orientation are layered via an insulating layer, the first electrode layer 1 of each unit cell 21 is connected to the negative electrode terminal 52, and the second electrode layer 5 of each unit cell 21 is connected to the positive electrode terminal 53. In this case, connection between the electrode layers 1, 5 and the electrode terminals 52, 53 may be performed by arranging the negative electrode terminal 52 between the insulating layer and the first electrode layer 1 and arranging the positive electrode terminal 53 between the insulating layer and the second electrode layer 5.

Here, the plurality of unit cells 21 include the unit cells 21 having different capacities. That is, the cell-sheet 30 of the present embodiment has a structure that the plurality of unit cells 21 having different capacities are connected in parallel. With quantum cells, even when cells having different capacities are connected in parallel, there arises no problem of over-charging and over-discharging. Accordingly, owing to connecting unit cells 21 that include cells having different capacities in parallel, the cell-sheet 30 having a large capacity can be actualized. Since the unit cells 21 having different capacities can be used, productivity can be improved. The unit cell 21 having a different capacity may be an adjustment-use unit cell 21a described later.

Here, obtaining the unit cell 21 having a different capacity may be performed, for example, by varying volume of the charging layer 3. The volume can be varied by varying thickness or area of the charging layer 3 illustrated in FIG. 1. Although the plurality of unit cells 21 are illustrated as having the same size in FIG. 2, they may be formed in different sizes. For example, the capacity may be varied as varying the area of the charging layer by cutting the manufactured unit cell 21.

In the present embodiment, the unit cells 21 having a variety of capacities may be combined, so that the cell-sheet 30 that satisfies a predetermined specification can be designed in a flexible manner. For example, in a case of manufacturing the cell-sheet 30 having a capacity satisfying the predetermined specification, the cell-sheet 30 satisfying the specification capacity value can be manufactured by preparing the unit cells 21 having different capacity values in advance and combining the unit cells 21. Accordingly, the capacity values of the unit cells are not required to be uniformed and an allowable range for capacities of the unit cells is widened. Therefore, productivity can be increased.

In a case that the cell-sheet 30 includes three or more unit cells 21, it is simply required that one or more unit cells 21 have capacities different from those of other unit cells 21. Further, the capacities of the unit cells having different capacities may be set based on a ratio between a capacity of a unit cell having the largest capacity and a capacity of a unit cell having the smallest capacity. For example, when the unit cell having the largest capacity among the unit cells 21 included in the cell-sheet 30 is called the maximum unit cell and the unit cell having the smallest capacity is called the minimum unit cell, it is preferable that a value of a ratio of a capacity Cmin of the minimum unit cell to a capacity Cmax of the maximum unit cell is 0.8 or smaller. According to the above, it is possible to widen a selection range of the capacities. Since unit cells having a variety of capacities can be used effectively, productivity can be improved.

Figure 3:
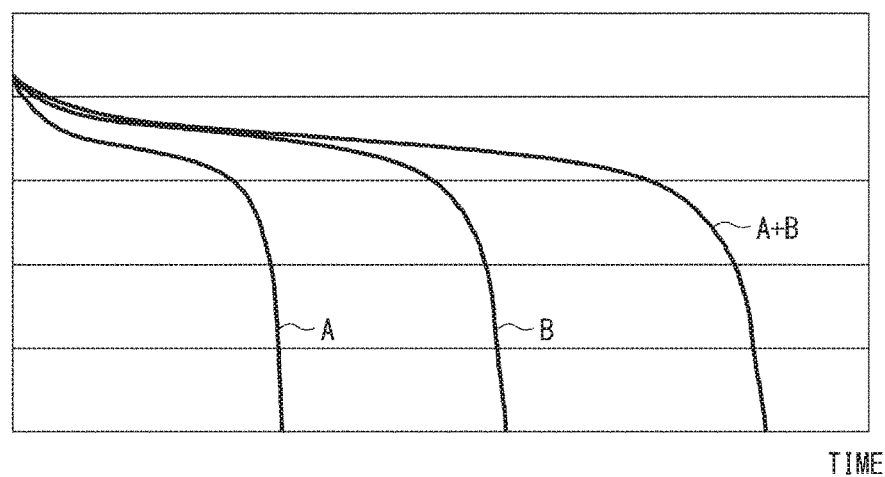
FIG. 3 is a graph indicating discharging characteristics of unit cells and a cell-sheet being samples.

Next, description will be provided with reference to FIG. 3 on a point that the unit cells 21 having different capacities can be combined. FIG. 3 is a graph indicating discharging characteristics of unit cells and a cell-sheet. In FIG. 3, the horizontal axis represents a discharging time and the vertical axis represents voltages. Discharging characteristics are indicated with three samples of unit cells and a cell-sheet. In FIG. 3, discharging curves are indicated with sample A being a unit cell 21 having a small capacity, sample B being a unit cell 21 having a large capacity, and sample (A+B) being a cell-sheet 3 in which those unit cells are connected in parallel. Here, a value of a ratio of the capacity of sample A to the capacity of sample B is 0.5.

As illustrated in FIG. 3, with both sample A and sample B, voltages gradually decrease along with discharging and voltages rapidly decrease respectively after specific time. Here, since the capacity of sample A is smaller than the capacity of sample B, the time at which the voltage rapidly decreases is earlier with sample A. That is, sample A having the small capacity reaches 0V earlier than sample B having the large capacity. In other words, since the capacity of sample B is larger than the capacity of sample A, sample B has a longer possible discharging time.

Sample (A+B) having sample A and sample B connected in parallel also provides a similar discharging curve to those of sample A and sample B. That is, a voltage gradually decreases until specific time and the voltage rapidly decreases after the specific time. Here, a discharging time and a capacity of sample (A+B) are approximately the same as in an added state of sample A and sample B. This explains that it is possible to use without a problem even if sample A and sample B having different capacities are combined in parallel. Naturally, the time at which the voltage rapidly decreases with sample (A+B) having a larger capacity is later than that with sample B. Since the capacity of sample (A+B) is larger than the capacity of sample B, sample (A+B) has a longer possible discharging time.

In a state that sample A and sample B having different capacities are connected in parallel, discharging with sample B having the large capacity is performed on a priority basis until the difference between the capacities vanishes. Accordingly, during discharging from a fully-charged state to some midpoint, a ratio of contribution to discharging varies in accordance with the capacity difference. In a case that sample (A+B) is discharged to 0V, sample A and sample B are discharged until both of them become 0V. Thus, both of the samples contribute to discharging and parallelly-connected sample (A+B) can be used without a problem. Here, with parallelly-connected sample (A+B), since sample B contributes more to discharging until the capacity difference vanishes, sample B is used more for discharging when full-charging after discharging to some midpoint is repeated. In the present embodiment, the ratio of capacity of the minimum unit cell to a capacity of the maximum unit cell among the plurality of unit cells to be combined is set based on assumption of a capacity in discharging to some midpoint. It is preferable that the capacity ratio is 0.5 or larger. That is, among the plurality of unit cells 21 to be combined, the capacity of the minimum unit cell is set to be a half or more of the capacity of the maximum unit cell. The reason thereof will be described in the following.

In the case that sample (A+B) is discharged to 0V, both sample A and sample B are discharged to 0V, respectively. In contrast, in the case that, after sample (A+B) is fully charged, full-charging after discharging to some midpoint is repeated, sample B contributes to discharging more than sample A. When the capacity difference between sample A and sample B becomes large, sample B having the large capacity contributes more to discharging and sample A contributes less to discharging. When charging-discharging from 100% (full-charging) to 70% is repeated in a case that the ratio value of the capacity of sample A to the capacity of sample B is smaller than 0.5, there is a fear that only sample B is concentrically used while sample A provide little contribution to discharging. Accordingly, in the present embodiment, the value of the ratio of the capacity Cmin of the minimum unit cell to the capacity Cmax of the maximum unit cell is set to 0.5 or larger. That is, the capacity Cmin of the minimum unit cell is set to be a half or more of the capacity Cmax of the maximum unit cell.

Further, in the cell-sheet 30 including the plurality of unit cells 21 having different capacities, the value Cr of the capacity ratio may be set based on the following expression (1) on the assumption of a case that discharging to a capacity at some midpoint is repeated.

$$Cr \geq Ch/(2-Ch) \qquad (1)$$

Here, Ch represents a value of a ratio of a remaining capacity to an entire capacity of a cell-sheet at a midpoint of discharging and Cr represents a value of a ratio of the capacity Cmin of the minimum unit cell to the capacity Cmax of the maximum unit cell. The capacity denotes an energy capacity (Wh) or a current capacity (Ah).

Thus, in the cell-sheet 30, the capacity Cmin of the minimum unit cell with respect to the capacity Cmax of the maximum unit cell among the unit cells 21 included in the cell-sheet 30 is set on the assumption that discharging to some midpoint is repeatedly performed. Even for a case that discharging to some midpoint is repeatedly performed, the unit cells 21 included in the cell-sheet 30 can be effectively used. Accordingly, the cell-sheet 30 having high performance can be actualized.

A quantum cell is not influenced by over-charging and over-discharging even in a case that samples having different capacities are connected in parallel. Accordingly, there is not a fear of being damaged by over-charging and over-discharging. A unit cell having a small capacity is prevented from becoming empty earlier than a unit cell having a large capacity. Accordingly, it is possible to prevent occurrence of rapid voltage drop during discharging. With quantum cells, even in a case that discharging is performed with unit cells having capacities being different from one another, the discharging is performed so that capacity difference is to be gradually decreased. Thus, even in a case that quantum cells having different capacities are combined, the cells can be appropriately used.

[Structure of Collective Cell]

Figure 4:
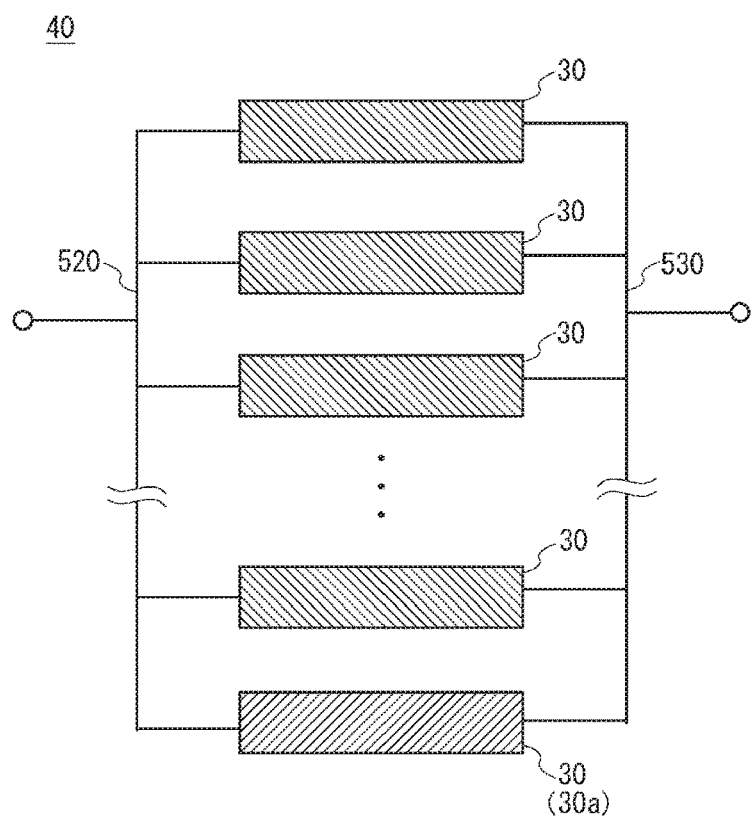
FIG. 4 is a view schematically illustrating a structure of a collective cell.

In the following, a structure of a collective cell according to the first embodiment will be described with reference to FIG. 4. FIG. 4 is a sectional view schematically illustrating a structure of a collective cell 40 according to the present embodiment. The collective cell 40 is a cell obtained by combining and electrically connecting a plurality of the cell-sheets 30 each being illustrated in FIG. 2.

The collective cell 40 may include the cell-sheets 30 that include unit cells 21 having different capacities. Further, the collective cell 40 may include the cell-sheets 30 having different capacities. For example, the collective cell 40 includes one or more cell-sheets, a capacity of which is different from others. The cell-sheet 30 having a different capacity may be an adjustment-use cell-sheet 30a described later.

The plurality of cell-sheets 30 are connected in parallel. A positive electrode wiring 530 is connected to the positive electrode terminals 53 of the plurality of cell-sheets 30. A negative electrode wiring 520 is connected to the negative electrode terminals 52 of the plurality of cell-sheets 30. Thus, the plurality of cell-sheets 30 are connected in parallel.

Further, in the collective cell 40, in addition to the plurality of cell-sheets 30 connected in parallel, one or more unit cells 21 having a capacity being smaller than the capacities thereof may be connected in parallel to the plurality of cell-sheets 30. The unit cell 21 to be added thereto may be an adjustment-use unit cell 21a described later. For example, the adjustment-use cell-sheet 30a may be replaced with the unit cell 21 in FIG. 4. In this case, the first electrode layer 1 of the unit cell 21 is connected to the negative electrode wiring 520 and the second electrode layer 5 is connected to the positive electrode wiring 530. Thus, the plurality of cell-sheets 30 and the unit cell 21 are connected in parallel.

Even with the collective cell 40 including cells having different capacities as described above, there arises no problem of over-charging and over-discharging for a quantum cell. Accordingly, the collective cell 40 having a large capacity can be actualized by connecting the cell-sheets 30 and the unit cell 21 having different capacities. Since the cell-sheet 30 having a different capacity can be used for adjustment-use, productivity can be improved. Here, the cell-sheet 30 having a different capacity may be obtained by changing a capacity or the number of the unit cells 21 that structure the unit-cell 30. The method to obtain a unit cell having a different capacity is as described above.

In the present embodiment, the cell-sheets 30 having a variety of capacities may be combined, so that the collective cell 40 that satisfies a predetermined specification can be designed in a flexible manner. For example, in a case of manufacturing the collective cell 40 having a capacity satisfying the predetermined specification, the collective cell 40 satisfying the specification capacity value can be manufactured by preparing the cell-sheets 30 having different capacity values in advance and combining the cell-sheets 30. Accordingly, the capacity values of the cell-sheets 30 are not required to be uniformed and an allowable range for capacities of the cell-sheets 30 is widened. Therefore, productivity can be improved.

In a case that the collective cell 40 includes three or more cell-sheets 30, it is simply required that one or more cell-sheets 30 have capacities different from those of other cell-sheets 30. In combining the cell-sheets 30 and the unit cells 21 having different capacities, the cell-sheets 30 and the adjustment-use unit cell 21 to be combined may be set based on a ratio between a capacity of a unit cell having the largest capacity (hereinafter, called an intra-collective-cell maximum unit cell) and a capacity of a unit cell having the smallest capacity (hereinafter, called an intra-collective-cell minimum unit cell) among all the unit cells 21 included in the collective cell 40, that is, the unit cells 21 and the adjustment unit cell 21a included in all the cell-sheets. When a capacity of the maximum unit cell and a capacity of the minimum unit cell of each cell-sheet are known, the capacity of the intra-collective-cell maximum unit cell and the capacity of the intra-collective-cell minimum unit cell can be easily known.

For example, it is preferable that a value of a ratio of a capacity Ctmin of the intra-collective-cell minimum unit cell to a capacity Ctmax of the intra-collective-cell maximum unit cell is 0.8 or smaller. According to the above, it is possible to widen a selection range of the capacities. Since cell-sheets having a variety of capacities can be used effectively, productivity can be improved.

In the present embodiment, the ratio of the capacity of the intra-collective-cell minimum unit cell to the capacity of the intra-collective-cell maximum unit cell among the plurality of cell-sheets and the adjustment-use unit cell to be combined is set based on assumption of a capacity in discharging to some midpoint. For example, on the assumption that charging-discharging is repeated from 100% (full-charging) to 70%, it is preferable that the value of the ratio of the capacity of the intra-collective-cell minimum unit cell to the capacity of the intra-collective-cell maximum unit cell is 0.5 or larger. That is, among the plurality of cell-sheets to be combined, the capacity of the intra-collective-cell minimum unit cell is set to be a half or more of the capacity of the intra-collective-cell maximum unit cell.

Further, in the collective cell 40 including the plurality of cell-sheets 30 and the adjustment-use unit cell 21a having different capacities, a value Ctr of the capacity ratio may be set based on the following expression (2) on the assumption of a case that discharging to a capacity at some midpoint is repeated.

$$Ctr \geq Cth/(2-Cth) \qquad (2)$$

Here, Cth represents a value of a ratio of a remaining capacity to an entire capacity of a collective cell at a midpoint of discharging and Ctr represents a value of a ratio of the capacity Ctmin of the intra-collective-cell minimum unit cell to the capacity Ctmax of the intra-collective-cell maximum unit cell. The capacity denotes an energy capacity (Wh) or a current capacity (Ah).

Thus, in the collective cell 40, the capacity Ctmin of the intra-collective-cell minimum unit cell to the capacity Ctmax of the intra-collective-cell maximum unit cell among the unit cells 21 included in the collective cell 40 is set on the assumption that discharging to some midpoint is repeatedly performed. Even for a case that discharging to some midpoint is repeatedly performed, the cell-sheets 30 included in the collective cell 40 can be effectively used. Accordingly, the collective cell 40 having high performance can be actualized.

[Method for Manufacturing Cell-Sheet]

Figure 5:
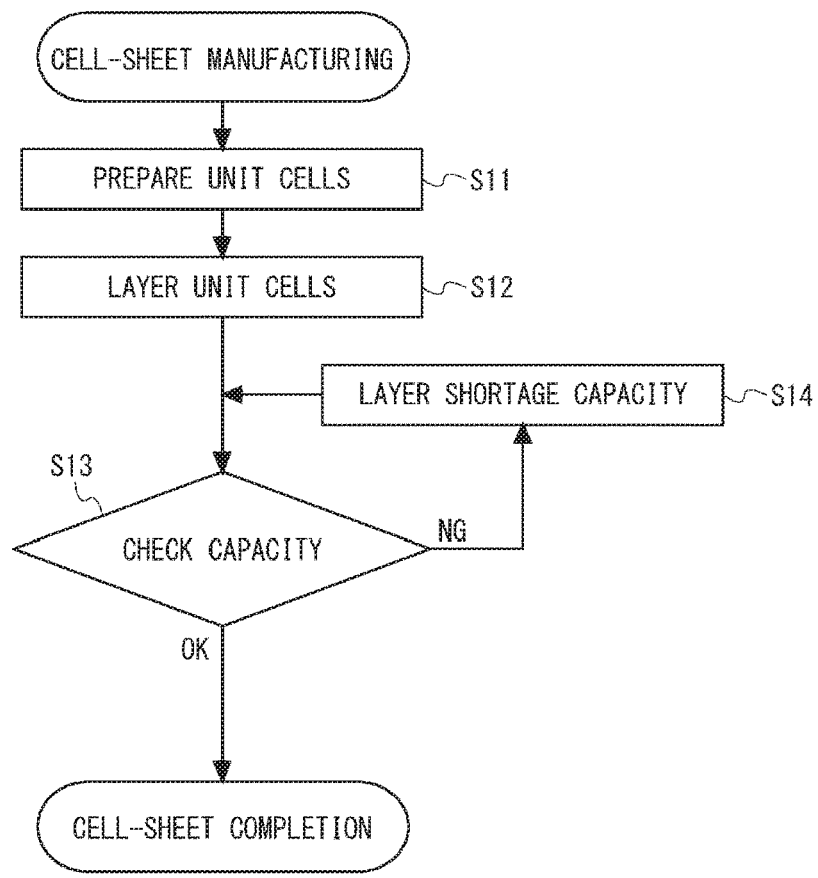
FIG. 5 is a flowchart illustrating a method for manufacturing a cell-sheet.
Figure 6:
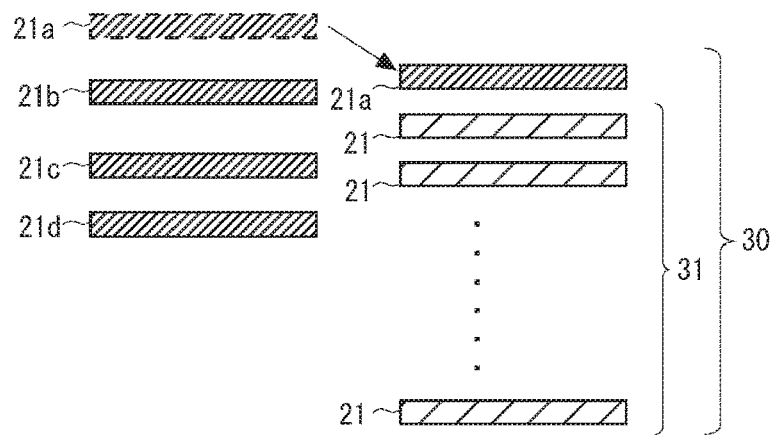
FIG. 6 is a view for explaining the method for manufacturing a cell-sheet.

In the following, description will be provided on a method for manufacturing a cell-sheet 30 according to the present embodiment. FIG. 5 is a flowchart illustrating the method for manufacturing a cell-sheet 30 according to the present embodiment. In the description of FIG. 5, a unit cell 21 is the sheet-shaped unit cell 21 illustrated in FIG. 1 and a cell-sheet 30 is the cell-sheet 30 having the plurality of unit cells 21. FIG. 6 is a view for explaining the method for manufacturing a cell-sheet.

First, sheet-shaped unit cells 21 are prepared (S11). Here, a plurality of the sheet-shaped unit cells 21 are prepared as illustrated in FIG. 6. For example, sixteen or more of the unit cells 21 are prepared. The plurality of unit cells 21 may have the same capacity or different capacities. Subsequently, the sheet-shaped unit cells 21 are layered (S12). For example, the plurality of unit cells 21 are layered as illustrated in FIG. 6. More specifically, the plurality of unit cells 21 are layered and connected in parallel as illustrated in FIG. 2. According to the above, a cell-sheet 31 before capacity thereof is adjusted having the plurality of unit cells 21 layered (hereinafter, called an unadjusted cell-sheet) is formed. In FIG. 6, the positive electrode terminal and the negative electrode terminal are not illustrated. Here, conditioning processing such as charging-discharging operation is performed on the unit cells 21 or the unadjusted cell-sheet 31 before the capacity thereof is measured.

Subsequently, the capacity of the unadjusted cell-sheet 31 is checked (S13). Specifically, it is determined using a cell capacity measuring device whether or not the capacity of the unadjusted cell-sheet 31 satisfies a predetermined specification. A device capable of measuring charging-discharging characteristics and electrical characteristics as including a charging-discharging power supply, a voltage meter, a current meter, a probe, or the like, for example, as disclosed in Patent Document 2, may be used as the cell capacity measuring device. The cell capacity measuring device may be a device capable of measuring a capacity after conditioning is performed thereon as having a conditioning function. A cell capacity is measured by measuring charging-discharging characteristics and the like of the unadjusted cell-sheet 31 that is connected to the cell capacity measuring device. When a measurement value of the cell capacity is equal to or larger than the predetermined specification value (OK in S13), the cell-sheet 30 is completed.

On the other hand, when the measurement value is smaller than the specification value (NO in S13), a cell is layered further by the amount of the capacity shortage (S14). For example, as illustrated in FIG. 6, the adjustment-use unit cell 21*a* is added to the unadjusted cell-sheet 31 including the plurality of unit cells 21 for supplementing the shortage amount. The adjustment-use unit cell 21*a* is connected to the plurality of unit cells 21 in parallel. Then, it is determined whether or not the capacity of the cell-sheet 30 with the adjustment-use unit cell 21*a* added is equal to or larger than the specification value (S13). Owing to that processing of S13 and S14 is repeated until the capacity of the cell-sheet becomes equal to or larger than the specification value, the cell-sheet 30 having the capacity that satisfies the specification is completed.

In FIGS. 5 and 6, the sheet-shaped unit cells 21 illustrated in FIG. 1 are layered. That is, the cell-sheet 30 is prepared by combining a plurality of the sheet-shaped unit cells 21. Specifically, the cell-sheet (cell) 30 including the plurality of unit cells is prepared. Thus, the cell-sheet 30 having a capacity that satisfies the specification can be prepared. Here, the adjustment-use unit cell 21*a* having the same structure as the abovementioned unit cell 21 may be manufactured with the same method as described above. It is preferable to be a unit cell having a capacity that is different from that of unit cells 21 included in the unadjusted cell-sheet.

Further, it is possible to prepare a plurality of adjustment-use unit cells 21*a* to 21*d* having different capacities as illustrated in FIG. 6, and to select the adjustment-use unit cell 21*a* being most suitable for a shortage capacity. For example, a shortage capacity of the unadjusted cell-sheet 31 is denoted by C and cell capacities of the adjustment-use unit cells 21*a* to 21*d* are denoted by Ca to Cd, respectively. The capacities Ca to Cd are measured in advance and different from one another. When the capacity Ca among the capacities Ca to Cd is equal to or larger than the shortage capacity C and is closest to the shortage capacity C, the adjustment-use unit cell 21*a* is to be selected. Thus, it is possible to prevent that the cell-sheet 30 having a significantly large capacity is prepared. Naturally, it is possible to add two or more of the adjustment-use unit cells. For example, in a case that each of the capacities Ca to Cd is smaller than the shortage capacity C, two adjustment-use unit cells 21*a* and 21*b* may be added.

In the structure illustrated in FIG. 6, the unit cells 21 included in the cell-sheet 30 are structured with the adjustment-use unit cell 21*a* and the plurality of unit cells 21 included in the unadjusted cell-sheet 31. Here, among all the unit cells 21 included in the cell-sheet 30, the unit cell having the smallest capacity is called the minimum unit cell and the unit cell having the largest capacity is called the maximum unit cell. On the assumption that discharging is repeated from 100% (full-charging) to 70% of the capacity with the cell-sheet 30, the value of the ratio of the capacity Cmin of the minimum unit cell to the capacity Cmax of the maximum unit cell is set to be equal to or larger than 0.5. In other words, the capacity Cmax of the maximum unit cell is equal to or smaller than two times of the capacity Cmin of the minimum unit cell. According to the above, as described with reference to FIG. 3, it is possible to prevent occurrence of a phenomenon that only specific cells repeatedly contribute to discharging.

Here, in the preparing process of the cell-sheet 30, it is also possible to provide a process to determine whether combination of the unit cells is suitable or not based on the ratio between the capacity of the maximum unit cell and the capacity of the minimum unit cell. For example, the determining of the suitability may be performed when a unit cell to be added for supplementing the shortage capacity is determined in S14.

Thus, in the cell-sheet 30, the value of the ratio of the capacity of the minimum unit cell to the capacity of the maximum unit cell among the unit cells 21 and the adjustment-use unit cell 21*a* included in the cell-sheet 30 is set to be 0.5 or larger on the assumption that discharging to some midpoint is repeatedly performed. Even for a case that discharging to some midpoint is repeatedly performed, the cell-sheet 30 having high performance can be actualized. In addition, design change to an arbitrary capacity is facilitated.

Further, in a case that a number (being a hundred or more, or a thousand or more) of the sheet-shaped unit cells 21 are to be combined, there is a possibility that a capacity of the capacity-unadjusted cell-sheet 31 becomes far below the specification value when capacities of the sheet-shaped unit cells 21 vary from one another. Even in such a case, owing to adding one or more adjustment-use unit cells 21*a*, it is possible to manufacture the cell-sheet 30 that easily satisfies the specification. Further, since a variety of capacities can be appropriately combined, designing is facilitated. Further, fine adjustment and change of capacities can be easily performed. Since unit cells having a variety of capacities can be used effectively, productivity can be improved.

[Method for Manufacturing Collective Cell]

Figure 7:
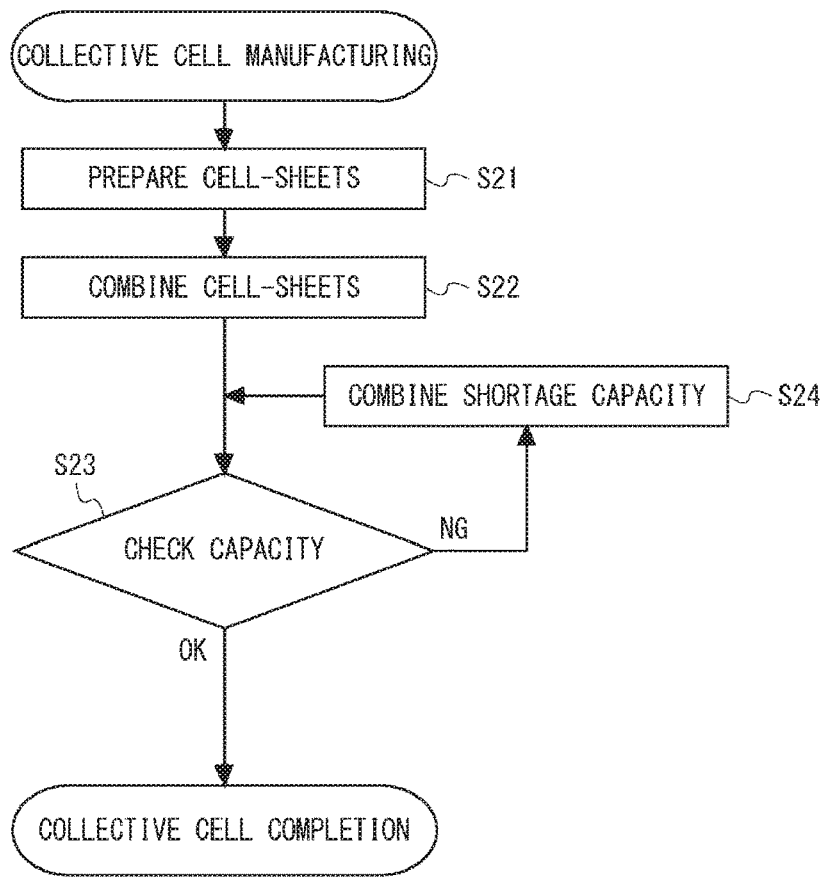
FIG. 7 is a flowchart illustrating a method for manufacturing a collective cell.
Figure 8:
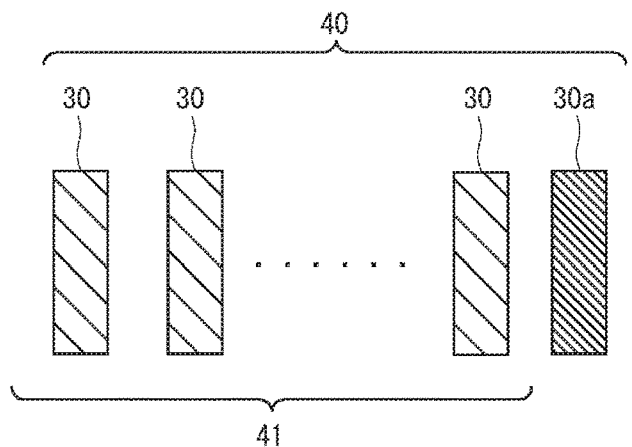
FIG. 8 is a view for explaining the method for manufacturing a collective cell.

Next, description will be provided on a method for manufacturing a collective cell of a quantum cell. FIG. 7 is a flowchart illustrating the method for manufacturing a collective cell. FIG. 8 is a view for explaining the method for manufacturing a collective cell. In FIGS. 7 and 8, the collective cell 40 is obtained by connecting the plurality of cell-sheets 30 in parallel.

In the method for manufacturing the collective cell 40 as well, a cell for capacity adjustment is added to supplement a shortage amount. Here, the unit cell 21 or the cell-sheet 30 may be used as the cell for capacity adjustment. The unit cell 21 used as the cell for capacity adjustment is called an adjustment-use unit cell and the cell-sheet 30 used thereas is called an adjustment-use cell-sheet. The adjustment-use unit cell and the adjustment-use cell-sheet are collectively called an adjustment-use cell.

First, cell-sheets 30 are prepared (S21). Here, a plurality of the cell-sheets 30 are prepared as illustrated in FIG. 8. For example, sixteen or more of the cell-sheets 30 are prepared. The plurality of cell-sheets 30 may have the same capacity or different capacities. Each of the cell-sheets 30 has a structure that the sheet-shaped unit cells 21 are layered as described above. Here, the cell-sheets 30 may be manufactured with the manufacturing method illustrated in FIG. 5 or another method.

Subsequently, the plurality of cell-sheets 30 are combined (S22). A collective cell 41 before capacity thereof is adjusted having the plurality of cell-sheets 30 connected in parallel (hereinafter, called an unadjusted collective cell) is formed as illustrated in FIG. 8. In FIG. 8, the positive electrode terminal and the negative electrode terminal are not illustrated. Here, conditioning processing such as charging-discharging operation is performed on the cell-sheets 30 of the collective cell 40 or the unit cells 21 of the cell-sheets 30 before the capacity thereof is measured.

Subsequently, the capacity of the unadjusted collective cell 41 (S23) is checked. Specifically, it is determined using a cell capacity measuring device whether or not the capacity of the unadjusted collective cell 41 satisfies a predetermined specification. The cell capacity measuring device may be the same one in the above description for the method for manufacturing the cell-sheet 30. A cell capacity is measured by measuring charging-discharging characteristics and the like of the unadjusted collective cell 41 that is connected to the cell capacity measuring device. When a measurement value of the cell capacity is equal to or larger than the predetermined specification value (OK in S23), the collective cell 40 is completed.

On the other hand, when the measurement value is smaller than the specification value (NG in S23), a cell is combined further by the amount of the capacity shortage (S24). For example, as illustrated in FIG. 8, the adjustment-use cell-sheet 30a is added to the unadjusted collective cell 41 including the plurality of cell-sheets 30 for supplementing the shortage amount. The adjustment-use cell-sheet 30a is connected to the plurality of cell-sheets 30 in parallel. Then, it is determined whether or not the capacity of the collective cell 40 with the adjustment-use cell-sheet 30a added is equal to or larger than the specification value (S23). Owing to that processing of S23 and S24 is repeated until the capacity of the collective cell 40 becomes equal to or larger than the specification value, the collective cell 40 having the capacity that satisfies the specification is completed. Here, it is simply required to select the adjustment-use cell-sheet 30a in accordance with a capacity measurement result from the plurality of cell-sheets 30 having different capacities prepared in advance as the adjustment-use cell-sheets.

In FIGS. 7 and 8, the collective cell 40 is formed by combining the plurality of cell-sheets 30. That is, the modularized collective cell 40 is prepared by combining the plurality of cell-sheets 30. Specifically, the collective cell (cell) 40 including the plurality of cell-sheets 30 is prepared having the cell-sheet 30 as a combination unit. Thus, the collective cell 40 having a capacity that satisfies the specification can be prepared. Here, the adjustment-use cell-sheet 30a having the same structure as the abovementioned cell-sheet 30 may be manufactured with the same method as described above. It is preferable to be a unit cell having a capacity that is different from that of the cell-sheets 30 included in the unadjusted collective cell.

In the above description, the adjustment-use cell-sheet 30a is added as the adjustment-use cell. However, instead of the adjustment-use cell-sheet 30a, it is also possible to add the adjustment-use unit cell 21a or to add combination of the adjustment-use cell-sheet 30a and the adjustment-use unit cell 21a. That is, it is simply required to add, to the unadjusted collective cell 41, at least one of the adjustment-use cell-sheet 30a and the adjustment-use unit cell 21a as the adjustment-use cell. The added adjustment-use cell is simply required to be connected to the unadjusted collective cell 41 in parallel.

In the structure illustrated in FIG. 8, the collective cell 40 includes the plurality of cell-sheets 40 and one or more of the adjustment-use cells. The cell-sheets 40 and the adjustment-use cells are structured with unit cells 21, respectively. Here, among all the unit cells 21 included in the collective cell 40, the unit cell having the smallest capacity is called the intra-collective-cell minimum unit cell and the unit cell having the largest capacity is called the intra-collective-cell maximum unit cell. On the assumption that discharging is repeated from full-charging (100%) to 70% of the capacity with the collective cell 40, the value of the ratio of the capacity Ctmin of the intra-collective-cell minimum unit cell to the capacity Ctmax of the intra-collective-cell maximum unit cell is set to be equal to or larger than 0.5. In other words, the capacity Ctmax of the intra-collective-cell maximum unit cell is equal to or smaller than two times of the capacity Ctmin of the intra-collective-cell minimum unit cell. According to the above, as described with reference to FIG. 3, it is possible to prevent occurrence of a phenomenon that only specific unit cells repeatedly perform discharging.

Thus, in the collective cell 40, the value of the ratio of the capacity of the intra-collective-cell minimum unit cell to the capacity of the intra-collective-cell maximum unit cell among all the unit cells included in the collective cell 40 is set to be 0.5 or larger on the assumption that discharging to some midpoint is repeatedly performed. Even for a case that discharging to some midpoint is repeatedly performed, the collective cell 40 having high performance can be actualized. In addition, design change to an arbitrary capacity is facilitated.

Here, in the preparing process of the collective cell 40, it is also possible to provide a process to determine whether combination of the cell-sheets 30 of the collective cell 40 and the adjustment-use cell is suitable or not based on the ratio between the capacity of the intra-collective-cell maximum unit cell and the capacity of the intra-collective-cell minimum unit cell. For example, the determining of the suitability may be performed when an adjustment-use cell to be added for supplementing the shortage capacity is determined in S24.

[Second Embodiment]

Figure 9:
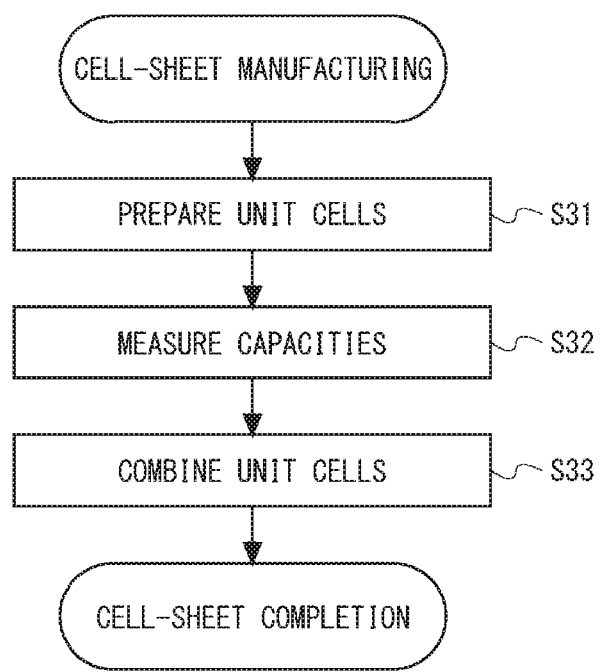
FIG. 9 is a flowchart illustrating a method for manufacturing a cell-sheet according to a second embodiment.
Figure 10:
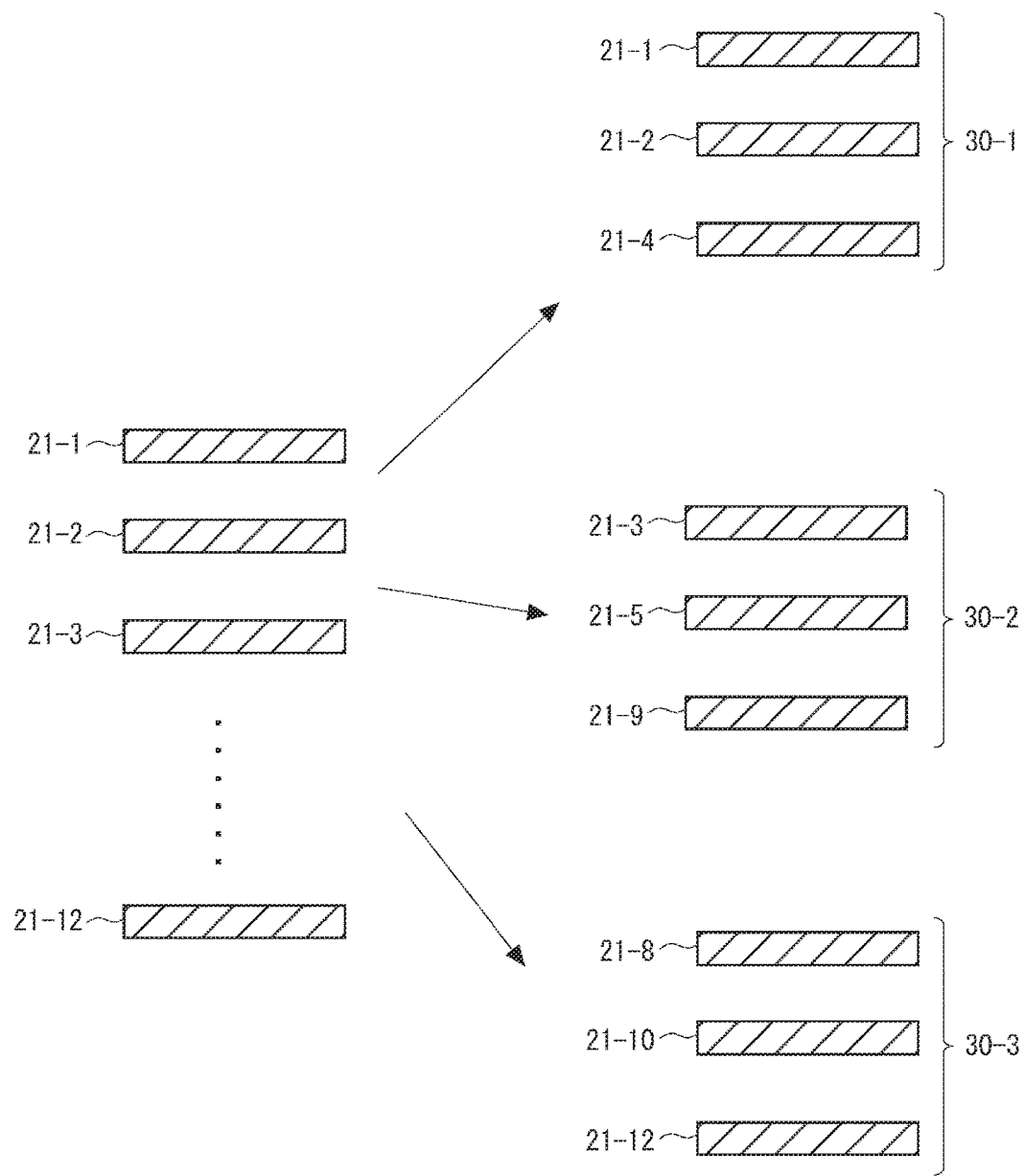
FIG. 10 is a view for explaining the method for manufacturing a cell-sheet according to the second embodiment.

Description will be provided on a method for manufacturing a cell according to the present embodiment with reference to FIGS. 9 and 10. FIG. 9 is a flowchart illustrating the method for manufacturing a cell-sheet 30. FIG. 10 is a view for explaining the method for manufacturing a cell-sheet 30. In the present embodiment, a cell having a capacity being equal to or larger than a specification value is prepared by combining a plurality of unit cells based on measurement results of the unit cells 21. FIGS. 9 and 10 illustrate an example of manufacturing three cell-sheets 30-1 to 30-3 using twelve unit cells 21-1 to 21-12 that are prepared in advance. Naturally, the number of cell-sheets 30 to be manufactured and the number of unit cells 21 to be included in the cell-sheet 30 are not limited to the example illustrated in the drawing.

First, sheet-shaped unit cells 21 are prepared as unit cells (S31). Here, twelve unit cells 21-1 to 21-12 are prepared as illustrated in FIG. 10. Then, a capacity of each of the unit cells 21-1 to 21-12 is measured (S32). The unit cells 21-1 to 21-12 are combined based on capacity measurement results (S33). For example, in a case of preparing the cell-sheet 30 including three unit cells 21, three unit cells 21 selected from the twelve unit cells 21-1 to 21-12 are connected in parallel and layered. Thus, three cell-sheets 30-1 to 30-3 having a capacity that is equal to or larger than a specification value are prepared.

Here, combinations of the unit cells 21-1 to 21-12 are determined based on the capacity measurement results of the respective unit cells 21-1 to 21-12 so that the three cell-sheets 30-1 to 30-3 satisfy capacity specification. The combinations are determined so that the total capacity of the three unit cells becomes equal to or larger than the specification of the cell-sheet 30. In FIG. 10, the cell-sheet 30-1 includes the unit cell 21-1, the unit cell 21-2, and the unit cell 21-4. The cell-sheet 30-2 includes the unit cell 21-3, the unit cell 21-5, and the unit cell 21-9. The cell-sheet 30-3 includes the unit cell 21-8, the unit cell 21-10, and the unit cell 21-12. Each of the cell-sheets 30-1 to 30-3 includes unit cells combined so as to satisfy capacity specification that is determined in advance.

For example, the specification value of an energy capacity of the cell-sheet 30 is 3 Wh and the number of the unit cells 21 structuring the cell-sheet 30 is basically three. The unit cells 21 are prepared in advance to have variations in a predetermined range including 1 Wh being the capacity obtained by dividing the capacity specification value by the basic number and are stocked. For example, the unit cells 21 are prepared to have variations in a range so that the ratio of the capacity Cmin of the minimum unit cell to the capacity Cmax of the maximum unit cell becomes equal to or larger than 0.5 as described above on the assumption that charging-discharging from full-charging to 70% is repeated. Specifically, the unit cells 21 are prepared to have variations in a range between 0.7 to 1.4 Wh. Regarding each of the prepared unit cells 21, a capacity thereof is measured after conditioning is performed thereon. An identification code is set for each unit cell. The measured capacity is stored, for example, in a computer or the like as being associated with the corresponding identification code.

Specifically, capacities of the twelve pieces of unit cells 21-1 to 21-12 are assumed as follows. Capacities of the unit cells 21-12 and 21-7 are 0.7 Wh and 0.8 Wh, respectively. Capacities of the unit cells 21-9 and 21-11 are 0.9 Wh, respectively. Capacities of the unit cells 21-1, 21-2, and 21-5 are 1.0 Wh, respectively. Capacities of the unit cells 21-4 and 21-8 are 1.1 Wh, respectively. Capacities of the unit cells 21-3, 21-10, and 21-6 are 1.2 Wh, 1.3 Wh, and 1.4 Wh, respectively.

The unit cells 21-1, 21-2, and 21-4 are selected for the cell-sheet 30-1 and the total capacity thereof is 3.1 Wh. The unit cells 21-3, 21-5, and 21-9 are selected for the cell-sheet 30-2 and the total capacity thereof is 3.1 Wh. The unit cells 21-8, 21-10, and 21-12 are selected for the cell-sheet 30-3 and the total capacity thereof is 3.1 Wh. By combining as described above, the three cell-sheets 30-1 to 30-3 satisfying the specification value (3 Wh) can be prepared using the unit cells 21-1 to 21-12. Accordingly, productivity can be improved. Naturally, combinations of the cells 21 are not limited to the above-mentioned example. It is simply required that the combinations of the unit cells are determined so that the unit cells 21-7, 21-9, 21-11, and 21-12 having small capacities are compensated with unit cells 21-3, 21-4, 21-6, 21-8, and 21-10 having large capacities. In the example described above, the unit cells are combined as targeting 3.1 Wh so that a capacity exceeding the specification value can be obtained and does not exceed the specification value significantly.

Here, newly-prepared unit cells may be added as needed to the unit cells 21-1 to 21-12 that have been prepared and stocked in advance and preparing of cell-sheets may be continuously performed with combinations of stocked unit cells including the added unit cells. According to the above, mass production can be performed effectively.

Thus, combinations of the unit cells to be included in the cell-sheets 30-1 to 30-3 are determined based on the measurement results of the capacities of the unit cells 21-1 to 21-12. Accordingly, combinations of the unit cells can be determined so as to prepare cell sheets having capacities equal to or larger than the specification value. Owing to variations of the capacities of the unit cells 21-1 to 21-12, appropriate combinations can be selected. Accordingly, the unit cells 21-1 to 21-12 can be utilized without waste and productivity can be improved.

Since a variety of capacities can be arbitrarily combined, designing is facilitated. Further, fine adjusting and changing of capacities are easily performed. Since the unit cells having a variety of capacities are effectively used, productivity can be improved.

In S33, suitability of the combination of the unit cells 21 may be determined in accordance with a capacity ratio between the unit cell having a maximum capacity and the unit cell having a minimum capacity among all the unit cells 21 included in the cell-sheet 30.

Here, the combinations of the cells 21 in S33 may be determined through calculation automatically performed by a computer or determined by an operator. Further, it is also possible to combine the manufacturing methods in the first embodiment and the second embodiment. For example, after performing combining of cells in S33, capacity checking of the cell-sheet and layering for a shortage capacity may be performed as described in S13 and S14 of FIG. 5. Further, in the second embodiment, the cell-sheet 30 obtained by combining the sheet-shaped unit cells 21 are formed as a cell. However, it is also possible to be applied to a method for manufacturing a cell being the collective cell 40 obtained by combining the cell-sheets 30.

In this case as well, a plurality (e.g., n pieces) of cell-sheets 30-1 to 30-$n$ are prepared in advance to have variations of capacities. The capacities of the cell-sheets 30-1 to 30-$n$ are measured and the measurement results are associated with identification codes of the cell-sheets 30-1 to 30-$n$ respectively and stored. At that time, the capacity of the maximum unit cell and the capacity of the minimum unit cell of the cell-sheets 30-1 to 30-$n$ may be stored as well. Then, a combination out of the plurality of cell-sheets 30-1 to 30-$n$ is determined so as to satisfy a capacity of a cell to be manufactured. In accordance with the determination, the plurality of corresponding cell-sheets are prepared and connected in parallel, so that the collective cell 40 is manufactured. Here, in addition to the cell-sheets 30-1 to 30-$n$, the unit cell 21 may be used as a cell to be combined.

For determining a combination of the cell-sheets 30-1 to 30-$n$ for the collective cell 40, suitability of the combination of the cell-sheets 30-1 to 30-$n$ may be determined based on a ratio between a capacity of the intra-collective-cell maximum unit cell and a capacity of the intra-collective-cell minimum unit cell. In this case as well, it is preferable that a lower limit of a value of the ratio of the capacity of the intra-collective-cell minimum unit cell to the capacity of the intra-collective-cell maximum unit cell is set on the assumption that charging-discharging to some midpoint capacity is repeatedly performed. It is preferable that the combination provide the ratio, for example, being 0.5 or larger.

According to an aspect of the present invention, it is provided a method for manufacturing a secondary cell having a plurality of unit cells that are connected in parallel, the method including steps of: preparing sheet-shaped unit cells each having a structure that a first electrode layer, a metal oxide semiconductor layer, a charging layer, and a second electrode layer are layered; forming a cell-sheet by layering the unit cells and connecting the unit cells in parallel; measuring a capacity of the cell-sheet; and connecting a unit cell for capacity adjustment to the cell-sheet in parallel when the capacity is smaller than a specification value. According to the above, since the unit cells having a variety of capacities can be used effectively, productivity can be improved.

According to an aspect of the present invention, it is provided a method for manufacturing a secondary cell having a plurality of unit cells that are connected in parallel, the method including steps of: preparing sheet-shaped unit cells each having a structure that a first electrode layer, a metal oxide semiconductor layer, a charging layer, and a second electrode layer are layered; measuring capacities of the unit cells, respectively; and manufacturing a cell-sheet obtained by combining and layering the unit cells having different capacities based on measurement results of the capacities and connecting the layered unit cells in parallel to have a capacity being equal to or larger than a specification value. According to the above, since the unit cells having a variety of capacities can be used effectively, productivity can be improved.

According to an aspect of the present invention, it is provided a method for manufacturing a secondary cell having a plurality of cell-sheets that are connected in parallel, the method including steps of: preparing cell-sheets each having a plurality of unit cells layered and connected in parallel after preparing sheet-shaped unit cells each having a structure that a first electrode layer, a metal oxide semiconductor layer, a charging layer, and a second electrode layer are layered; forming a collective cell by connecting cell-sheets in parallel; measuring a capacity of the collective cell; and connecting at least one of a unit cell for capacity adjustment and a cell-sheet for capacity adjustment to the collective cell in parallel when the capacity is smaller than a specification value. According to the above, since the cell-sheets having a variety of capacities can be used effectively, productivity can be improved. Here, the collective cell may include the cell-sheets having different capacities.

According to an aspect of the present invention, it is provided a method for manufacturing a secondary cell having a plurality of cell-sheets that are connected in parallel, the method including steps of: preparing cell-sheets each having a plurality of unit cells layered and connected in parallel after preparing sheet-shaped unit cells each having a structure that a first electrode layer, a metal oxide semiconductor layer, a charging layer, and a second electrode layer are layered; measuring capacities of the cell-sheets; and manufacturing a collective cell by combining and layering the cell-sheets having different capacities based on measurement results of the capacities and connecting the layered cell-sheets in parallel to have a capacity being equal to or larger than a specification value. According to the above, since the cell-sheets having a variety of capacities can be used effectively, productivity can be improved.

Here, the cell-sheet may include the unit cells having different capacities.

According to an aspect of the present invention, it is provided a secondary cell in which at least two unit cells are connected in parallel. Here, each of the unit cells has a structure that a first electrode, a metal oxide semiconductor layer, a charging layer, and a second electrode are layered, and the at least two unit cells include unit cells having different capacities. According to the above, since the unit cells having a variety of capacities can be used effectively, productivity can be improved.

Here, suitability of a combination of the unit cells may be determined in accordance with a capacity ratio between a unit cell having a maximum capacity and a unit cell having a minimum capacity among all the unit cells included in the cell-sheet.

Here, suitability of a combination of the cell-sheets may be determined in accordance with a capacity ratio between a unit cell having a maximum capacity and a unit cell having a minimum capacity among all the unit cells included in the collective cell.

Here, a plurality of unit cells having different capacities may be prepared in advance as the unit cells for capacity adjustment, and the unit cell for capacity adjustment may be selected in accordance with measurement results of the capacities.

Here, a plurality of the cell-sheets having different capacities may be prepared in advance as the cell-sheets for capacity adjustment, and the cell-sheet for capacity adjustment may be selected in accordance with measurement results of the capacities.

According to an aspect of the present invention, it is provided a secondary cell in which at least two cell-sheets are connected in parallel. Here, each of the cell-sheets includes a plurality of sheet-shaped unit cells that are connected in parallel; each of the unit cells has a structure that a first electrode, a metal oxide semiconductor layer, a charging layer, and a second electrode are layered; and the at least two unit cells include unit cells having different capacities. According to the above, since the cell-sheets having a variety of capacities can be used effectively, productivity can be improved.

Here, it is preferable that a capacity ratio between a unit cell having the minimum capacity and a unit cell having the maximum capacity among all the unit cells included in the secondary cell is 50% or larger and 80% or smaller.

In the above, the embodiments of the present invention are described. Here, the present invention includes appropriate modifications thereof without departing from the object and effects thereof and is not limited to the above-mentioned embodiments.

This application is based upon and claims the benefit of priority from Japanese patent application No. 2015-176250, filed on Sep. 8, 2015, the disclosure of which is incorporated herein in its entirety by reference.

REFERENCE SIGNS LIST

1 First electrode layer
2 N-type semiconductor layer
3 Charging layer
4 P-type semiconductor layer
5 Second electrode layer
10 Substrate
21 Cell (Unit cell)
21a to 21d Adjustment-use unit cell
21-1 to 21-12 Unit cell
30 Cell-sheet
30-1 to 30-3 Cell-sheet
31 Unadjusted cell-sheet
40 Collective cell
41 Unadjusted collective cell

The invention claimed is:
1. A method for manufacturing a secondary cell having a plurality of cell-sheets that are connected in parallel, comprising steps of:
   preparing cell-sheets each having a plurality of unit cells layered and connected in parallel after preparing sheet-shaped unit cells each having a structure in which a first electrode layer, a metal oxide semiconductor layer, a charging layer, and a second electrode layer are layered;
   forming a collective cell by connecting cell-sheets in parallel;
   measuring a capacity of the collective cell; and connecting at least one of a unit cell for capacity adjustment and a cell-sheet for capacity adjustment to the collective cell in parallel when the capacity is smaller than a specification value.
2. The method for manufacturing a secondary cell according to claim 1, wherein the collective cell includes the cell-sheets having different capacities.

3. The method for manufacturing a secondary cell according to claim 1, wherein a plurality of the cell-sheets having different capacities are prepared in advance as the cell-sheets for capacity adjustment, and the cell-sheet for capacity adjustment is selected in accordance with measurement results of the capacities.

* * * * *